United States Patent [19]

Matsui et al.

[11] Patent Number: 5,311,072
[45] Date of Patent: May 10, 1994

[54] APPARATUS FOR SAMPLING AND HOLDING ANALOG DATA FOR A LIQUID CRYSTAL DISPLAY

[75] Inventors: Kiyohisa Matsui, Tenri; Junji Tanaka, Sakurai; Yoshiki Sano, Kashihara, all of Japan

[73] Assignee: Sharp Kabushiki Kaisha, Osaka, Japan

[21] Appl. No.: 944,088

[22] Filed: Sep. 11, 1992

[30] Foreign Application Priority Data

Sep. 12, 1991 [JP] Japan ................. 3-262891

[51] Int. Cl.⁵ ........................................... H03K 5/159
[52] U.S. Cl. ................................... 307/353; 328/151
[58] Field of Search ......................... 307/353; 328/151

[56] References Cited

U.S. PATENT DOCUMENTS

| | | | |
|---|---|---|---|
| 3,050,673 | 8/1962 | Widmer | 307/353 |
| 3,479,534 | 11/1969 | Miller | 307/353 |
| 3,778,725 | 12/1973 | Spaagaren et al. | 328/151 |
| 4,728,811 | 3/1988 | Iida et al. | 307/353 |
| 4,781,437 | 11/1988 | Shields et al. | 307/353 |
| 4,980,686 | 12/1990 | Gulczynski | 328/151 |
| 5,206,543 | 4/1993 | Takita et al. | 307/353 |

*Primary Examiner*—John T. Kwon

[57] ABSTRACT

A sample/hold apparatus includes at least one sample/hold circuit. The at least one sample/hold circuit has a resistor connected to an input bus at one end thereof, a sampling gate connected to the other end of the resistor at one end thereof for opening and closing in response to a sampling signal supplied thereto, and a first capacitor connected to the other end of the sampling gate at one end thereof for holding analog data supplied from the input bus through the resistor and the sampling gate.

27 Claims, 2 Drawing Sheets

APPARATUS FOR SAMPLING AND HOLDING ANALOG DATA FOR A LIQUID CRYSTAL DISPLAY

BACKGROUND OF THE INVENTION

1. Field of the Invention

The present invention relates to a sample/hold apparatus which may mainly apply to a liquid crystal driving circuit provided in a liquid crystal display.

2. Description of the Related Art

A typical sample/hold circuit provided in a liquid crystal driving circuit known by the inventors of the present application is arranged to have a sampling gate connected to a common input bus, a transfer gate connected to the sampling gate, a buffer amplifier connected to the transfer gate, a sampling capacitor connected to a line between the sampling gate and the transfer gate and a holding capacitor connected to a line between the transfer gate and the buffer amplifier. In operation, when a sampling signal is applied to the sampling gate, the sampling gate operates to open on the timing indicated by the sampling signal. Each time it is open, analog data is transferred from the input bus to the sampling capacitor. When a transfer signal is applied to the transfer gate, the transfer gate operates to open on the timing indicated by the transfer signal. Each time the transfer gate opens, the analog data held in the sampling capacitor is transferred to the holding capacitor, from which the analog data is sent to the buffer amplifier. The buffer amplifier serves to amplify the analog data and supply the resulting signal as an output for driving the liquid crystal.

Two or more of the known sample/hold circuits are typically connected to the input bus.

As shown in FIG. 1, when the sampling signal Sn falls, the sampling gate SGn operates to open. Then, after a time has passed when the analog data can be held in the sampling capacitor CSn, the sampling signal Sn rises, the sampling gate operates to close. However, the sampling capacitor may hold such a historical voltage as causing a voltage to be abruptly charged or discharged when the sampling gate changes from a close state to an open state. The abrupt charge or discharge may have an adverse effect such as noises on the input bus.

At the timing when the sampling gate starts to close as shown in FIG. 1, another sampling signal Sn+1 (to be applied to the adjacent sample/hold circuit connected to the input bus) falls, when the sampling gate SGn+1 operates to open. As such, the voltage charged in the sampling capacitor CSn+1 may causes noises to appear on the input bus, thereby allowing the noises to be charged in the sampling capacitor CSn. This results in disallowing the sampling capacitor CSn to read the original analog data, thereby impairing the accuracy on signal transmission.

As has been easily understood from the above description, the component indicated by the subscript "n+1" means a signal adjacent to the signal with a subscript "n".

SUMMARY OF THE INVENTION

It is an object of the present invention to provide a sample/hold apparatus which is capable of reducing noises giving an adverse effect on an input bus connected to the sample/hold apparatus itself.

The object is achieved by a sample/hold apparatus including at least one sample/hold circuit, the at least one sample/hold circuit comprising: a resistor connected to an input bus at one end thereof; a sampling gate connected to the other end of the resistor at one end thereof for opening and closing in response to a sampling signal supplied thereto; and a sampling capacitor connected to the other end of the sampling gate at one end thereof for holding analog data supplied from the input bus through the resistor and the sampling gate.

In operation, the sample/hold circuit according to the first aspect of the invention has the resistor connected between the input bus and the input of the sampling gate. The resistor serves to suppress the level of the noises to be intruded into the analog input signal. This leads to reducing the noises giving an adverse effect on the input bus and the other circuits connected to the input bus.

Further objects and advantages of the present invention will be apparent from the following description of the preferred embodiments of the invention as illustrated in the accompanying drawings.

DESCRIPTION OF THE PREFERRED EMBODIMENTS

Herein, the description will be directed to an embodiment of a sample/hold apparatus for a liquid crystal driving circuit provided in a liquid crystal display unit.

Figure 2:
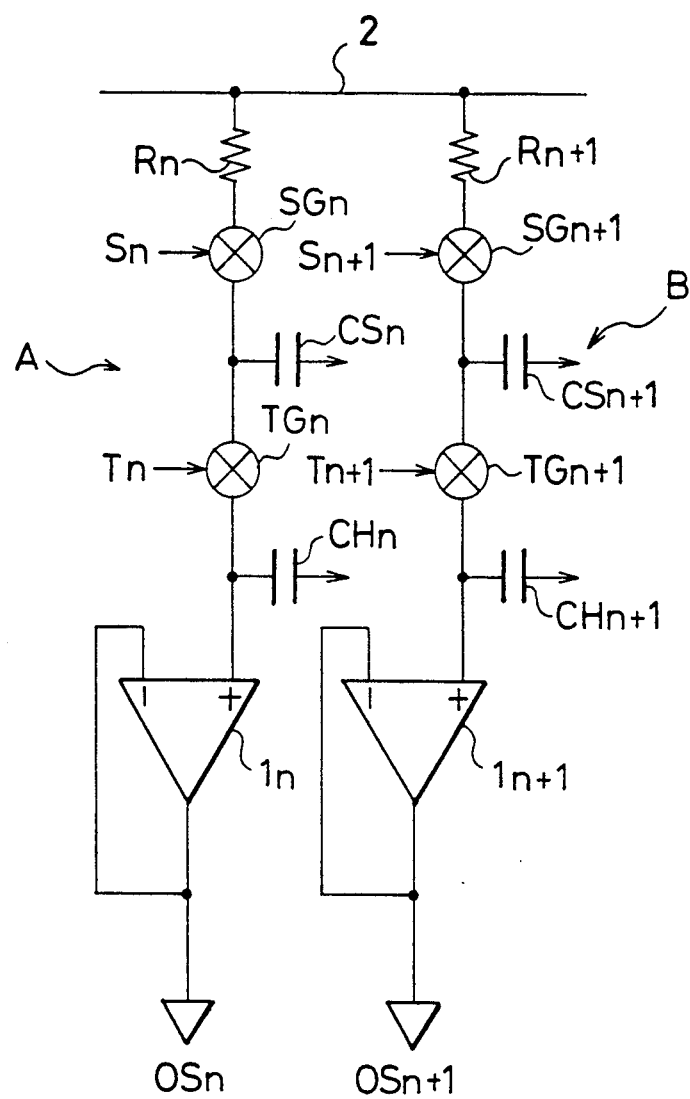
FIG. 2 is a circuit diagram showing a sample/hold apparatus according to an embodiment of the invention.

FIG. 2 is a circuit diagram showing this embodiment of the circuit. A numeral 2 denotes an input bus (on which a video signal is transmitted) guided from a display control circuit (not shown) provided in the liquid crystal display unit. A plurality of sample/hold circuits are connected on the input bus 2 so that the output of each circuit may be guided to a liquid crystal display unit (not shown). In FIG. 2, just two sample/hold circuits A and B are shown.

Now, the description will be directed to the arrangement and the operation of the sample/hold circuit A.

As shown in FIG. 2, the sample/hold circuit A is arranged to have a resistor Rn, a sampling gate SGn, a sampling capacitor CSn, a transfer gate TGn, a holding capacitor CHn, and a buffer amplifier 1n.

The resistor Rn is connected between the input bus 2 and the sampling gate SGn. The sampling gate SGn (corresponding to an analog switch) operates to open or close on the timing by a sampling signal Sn guided from the display control circuit (not shown).

A sampling capacitor CSn is connected between an output of the sampling gate SGn and a power supply line (or ground line). The analog data is supplied from the input bus 2 through the resistor Rn and then is transferred to the sampling capacitor CSn through the sampling gate SGn when the gate SGn changes from a close state to an open state.

At an output stage of the sampling gate SGn, the transfer gate TGn is connected in addition to the sampling capacitor CSn. The transfer gate TGn is also an analog switch like the sampling gate SGn and is operated to open or close on the timing indicated by a transfer signal Tn guided from the display control circuit.

A holding capacitor CHn is connected between the output of the transfer gate TGn and the power supply line (or ground line). In the connection, the analog data held in the sampling capacitor CSn is transferred to the holding capacitor CHn through the transfer gate TGn on the timing when the transfer gate TGn changes from a close state to an open state.

At an output stage of the transfer gate TGn, a buffer amplifier 1n is connected in addition to the holding capacitor CHn. At an output stage of the buffer amplifier 1n, the liquid crystal display (not shown) is connected. In the connection, the analog data held in the holding capacitor CHn is guided as an output OSn for driving liquid crystal to the liquid crystal display through the buffer amplifier 1n.

The other sample/hold circuit B has the same arrangement and operation. The components and signals relevant to the sample/hold circuit A are indicated by notes with a subscript n, while those relevant to the sample/hold circuit B are indicated by notes with a subscript n+1.

Figure 1:
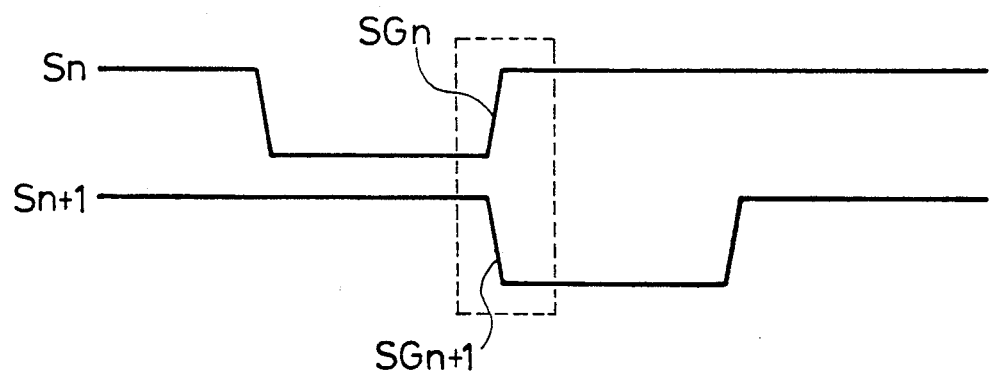
FIG. 1 is a timing chart showing an operation of a sampling signal.

FIG. 1 is a timing chart showing the sampling signals Sn and Sn+1. When the sampling signal Sn falls, the sampling gate SGn operates to open. Then, after a time has passed when the analog data can be held in the sampling capacitor CSn, the sampling signal Sn rises, the sampling gate operates to close. On the timing when the sampling gate Gn closes, the sampling signal Sn+1 falls, when the sapling gate SGn+1 operates to open.

However, the sampling capacitor CSn may hold such a historical voltage as causing a voltage to be abruptly charged or discharged when the sampling gate changes from a close state to an open state. The abrupt charge or discharge may have an adverse effect such as noises on the input bus. This holds true to the foregoing sample/hold circuit known by the inventors.

The known circuit may have an adverse effect of noises on the input bus 2 when the abrupt charge or discharge takes place. In the circuit of this embodiment, the resistor Rn connected between the input bus 2 and the sampling gate SGn serves to reduce the level of the noises, thereby suppressing the adverse effect of the noises to be intruded onto the input bus line.

This results in suppressing the adverse effect of the noises caused in one circuit on the other circuits. The adverse effect of the noises caused in the sample/hold circuit B is allowed to be suppressed to a practically negligible extent. That is, though when the sampling gate SGn+1 opens, the sampling gate SGn closes, the noises sent on the input bus 2 originally have the small level and besides the resistor Rn serves to reduce the level. Hence, the sample/hold circuit A enables to read the original analog data.

Further, in the sample/hold circuits A and B, the resistors Rn and Rn+1 have the same resistance, the resampling capacitors CSn and CHn+1 have the same capacitance and the holding capacitors CHn and CHn+1 have the same capacitance. As such, the resulting outputs OSn and OSn+1 for driving the liquid crystal may be kept far less variable.

The foregoing description holds true to all the sample/hold circuits connected to the input bus 2. This makes great contribution to enhancing the accuracy of the overall circuits and the liquid crystal display unit.

The sample/hold circuit according to the invention may apply to another circuit rather than the liquid crystal driving circuit for a liquid crystal display and only a single sample/hold circuit is allowed to be connected to the input bus. Further, in place of the resistor being located between the input bus and the sampling gate, the resistor may be located between the sampling gate and the sampling capacitor.

Many widely different embodiments of the present invention may be constructed without departing from the spirit and scope of the present invention. It should be understood that the present invention is not limited to the specific embodiments described in the specification, except as defined in the appended claims.

What is claimed is:

1. A sample/hold apparatus including at least one sample/hold circuit, said at least one sample/hold circuit comprising:
   a resistor connected to an input bus at one end thereof;
   a sampling gate connected to the other end of said resistor at one end thereof for opening and closing in response to a sampling signal supplied thereto; and
   a first capacitor connected to the other end of said sampling gate at one end thereof for holding analog data supplied from said input bus through said resistor and said sampling gate.

2. The sample/hold apparatus of claim 1, wherein said sampling gate includes an analog switch.

3. The sample/hold apparatus of claim 2, wherein the other end of said first capacitor is connected to a power supply line.

4. The sample/hold apparatus of claim 2, wherein the other end of said first capacitor is connected to a power supply line.

5. The sample/hold apparatus of claim 1, said at least one sample/hold circuit further comprising:
   a transfer gate connected to the other end of said sampling gate at one end thereof for opening and closing in response to a transfer signal supplied thereto and
   a second capacitor connected to the other end of said transfer gate at one end thereof for holding the analog data supplied from said first capacitor through said transfer gate.

6. The sample/hold apparatus of claim 5, wherein the other end of said second capacitor is connected to a power supply line.

7. The sample/hold apparatus of claim 5, wherein the other end of said second capacitor is connected to a ground line.

8. The sample/hold apparatus of claim 1, wherein said sample/hold apparatus comprises two sample/hold circuits, each of said two sample/hold circuits including a resistor connected to the input bus at one end thereof, a sampling gate connected to the other end of said resistor at one end thereof for opening and closing in response to a sampling signal supplied thereto, and a first capacitor connected to the other end of said sampling gate at one end thereof for holding analog data supplied from said input bus through said resistor and said sampling gate, wherein the resistors have equivalent resistances, and the first capacitors have equivalent capacitances.

9. The sample/hold apparatus of claim 8, wherein the other end of said first capacitor is connected to a power supply line.

10. The sample/hold apparatus of claim 8, wherein the other end of said first capacitor is connected to a ground line.

11. The sample/hold apparatus of claim 1, wherein the other end of said first capacitor is connected to a power supply line.

12. The sample/hold apparatus of claim 1, wherein the other end of said first capacitor is connected to a ground line.

13. A sample/hold apparatus including at least one sample/hold circuit, said at least one sample/hold circuit comprising:
   a resistor connected to an input bus at one end thereof;
   a sample gate connected to the other end of said resistor at one end thereof for opening and closing in response to a sampling signal supplied thereto;
   a first capacitor connected to the other end of said sampling gate at one end thereof for holding analog data supplied from said input bus through said resistor and said sampling gate;
   a transfer gate connected to the other end of said sampling gate at one end thereof for opening and closing in response to a transfer signal supplied thereto; and
   a second capacitor connected to the other end of said transfer gate at one end thereof for holding the analog data supplied from said first capacitor through said transfer gate.

14. The sample/hold apparatus of claim 13, wherein the other end of said first and second capacitors are connected to a power supply line.

15. The sample/hold apparatus of claim 13, wherein the other end of said first and capacitors are connected to a ground line.

16. A sample/hold apparatus including two sample/hold circuits, each of said two sample/hold circuits comprising:
   a resistor connected to an input bus at one end thereof;
   a sampling gate connected to the other end of said resistor at one end thereof for opening and closing in response to a sampling signal supplied thereof;
   a first capacitor connected to the other end of said sampling gate at one end thereof for holding analog data supplied from said input bus through said resistor and said sampling gate;
   wherein said resistors have equivalent resistances and said first capacitors have equivalent capacitances.

17. The sample/hold apparatus of claim 16, wherein the other end of said first capacity is connected to a power supply line.

18. The sample/hold apparatus of claim 16, wherein the other end of said first capacitor is connected to a ground line.

19. A sample/hold apparatus including a plurality of sample/hold circuits, each of said plurality of sample/hold circuits comprising:
   a resistor connected to an input bus at one end thereof;
   a sampling gate connected to the other end of said resistor at one end thereof for opening and closing in response to a sampling signal supplied thereto; and
   a first capacitor connected to the other end of said sampling gate at one end thereof for holding analog data supplied from said input bus through said resistor and said sampling gate.

20. The sample/hold apparatus of claim 19, wherein said sampling gate includes an analog switch.

21. The sample/hold apparatus of claim 20, wherein the other end of said first capacitor is connected to a power supply line.

22. The sample/hold apparatus of claim 20, wherein the other end of said capacitor is connected to a ground line.

23. The sample/hold apparatus of claim 19, each of said sample/hold circuits further comprising:
   a transfer gate connected to the other end of said sampling gate at one end thereof for opening and closing in response to a transfer signal supplied thereto; and
   a second capacitor connected to the other end of said transfer gate at one end thereof for holding the analog data supplied from said first capacitor through said transfer gate.

24. The sample/hold apparatus of claim 23, wherein the other end of said first and second capacitors are connected to a power supply line.

25. The sample/hold apparatus of claim 23, wherein the other end of said first and second capacitors are connected to a ground line.

26. The sample/hold apparatus of claim 19, wherein the other end of said first capacitor is connected to a power supply line.

27. The sample/hold apparatus of claim 19, wherein the other end of said first capacitor is connected to a ground line.

* * * * *